(12) United States Patent
Bourlier et al.

(10) Patent No.: US 10,779,446 B2
(45) Date of Patent: Sep. 15, 2020

(54) DEVICE FOR COOLING A POWER ELECTRONICS CIRCUIT

(71) Applicant: MOTEURS LEROY-SOMER, Angouleme (FR)

(72) Inventors: Ludovic Bourlier, Angouleme (FR); Aurelien Courage, Givors (FR); Thierry Crespo, Voeil et Giget (FR)

(73) Assignee: MOTEURS LEROY-SOMER, Angouleme (FR)

( * ) Notice: Subject to any disclaimer, the term of this patent is extended or adjusted under 35 U.S.C. 154(b) by 0 days.

(21) Appl. No.: 16/317,210

(22) PCT Filed: Jul. 10, 2017

(86) PCT No.: PCT/EP2017/067296
§ 371 (c)(1),
(2) Date: Jan. 11, 2019

(87) PCT Pub. No.: WO2018/011152
PCT Pub. Date: Jan. 18, 2018

(65) Prior Publication Data
US 2019/0230826 A1    Jul. 25, 2019

(30) Foreign Application Priority Data

Jul. 12, 2016 (FR) ..................... 16 56690

(51) Int. Cl.
*H05K 7/20* (2006.01)
*H02K 11/33* (2016.01)
(Continued)

(52) U.S. Cl.
CPC ....... *H05K 7/20927* (2013.01); *H01L 23/427* (2013.01); *H01L 23/473* (2013.01);
(Continued)

(58) Field of Classification Search
CPC . H01L 23/4006; H01L 23/427; H01L 23/473; H01L 23/34; H01L 21/4871;
(Continued)

(56) References Cited

U.S. PATENT DOCUMENTS

| 6,845,012 B2 * | 1/2005 | Ohkouchi ........... H01L 23/4006 257/675 |
| 2013/0206370 A1 | 8/2013 | Smalen et al. |
| 2015/0096719 A1 | 4/2015 | Moskaitis et al. |

FOREIGN PATENT DOCUMENTS

| DE | 10 2006 057 796 A1 | 6/2007 |
| DE | 10 2009 029 704 A1 | 12/2010 |
| EP | 2 629 594 A1 | 8/2013 |

OTHER PUBLICATIONS

International Search Report dated Sep. 27, 2017 in PCT/EP2017/067296 filed Jul. 10, 2017.
(Continued)

*Primary Examiner* — Jasmine J Clark
(74) *Attorney, Agent, or Firm* — Oblon, McClelland, Maier & Neustadt, L.L.P.

(57) ABSTRACT

Device (1) for cooling at least one power electronics circuit (4), including: a liquid-cooled heatsink (2); and an interface plate (3) that is in thermal contact with the heatsink (2) and to which the one or more power electronics circuits (4) are attached, the interface plate (3), including at least one thermosiphon (6), being removably mounted on the heatsink (2) so as to be capable of being separated therefrom with the one or more electronic circuits (4) attached thereto.

12 Claims, 1 Drawing Sheet

(51) Int. Cl.
 H01L 23/427 (2006.01)
 H01L 23/473 (2006.01)
(52) U.S. Cl.
 CPC ............. *H02K 11/33* (2016.01); *H05K 7/209* (2013.01); *H05K 7/20245* (2013.01); *H05K 7/20254* (2013.01); *H05K 7/20936* (2013.01)
(58) Field of Classification Search
 CPC .... H02K 11/33; H05K 7/209; H05K 7/20245; H05K 7/20936; H05K 7/20254; H05K 7/20927
 See application file for complete search history.

(56) References Cited

OTHER PUBLICATIONS

French Preliminary Search Report dated Mar. 16, 2017 in French Application 16 56690 filed Jul. 12, 2016.

\* cited by examiner

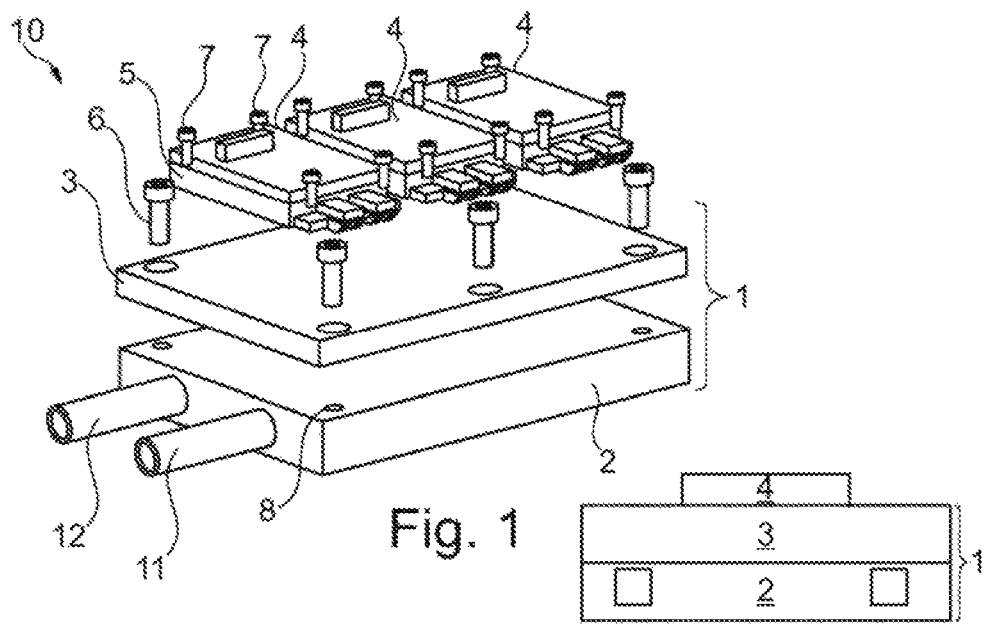
Fig. 1
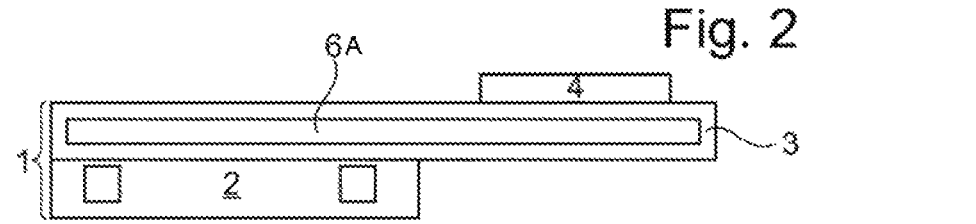
Fig. 2
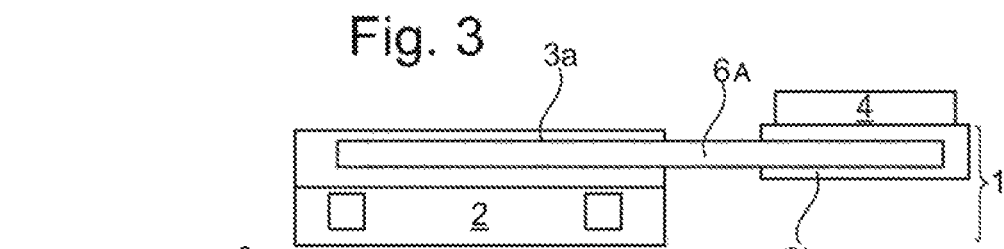
Fig. 3
Fig. 4
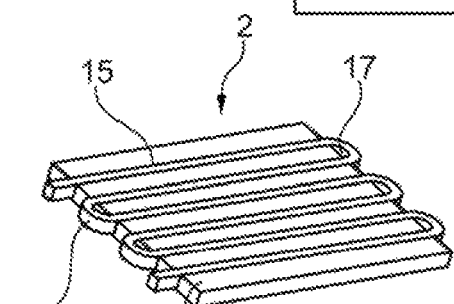
Fig. 5
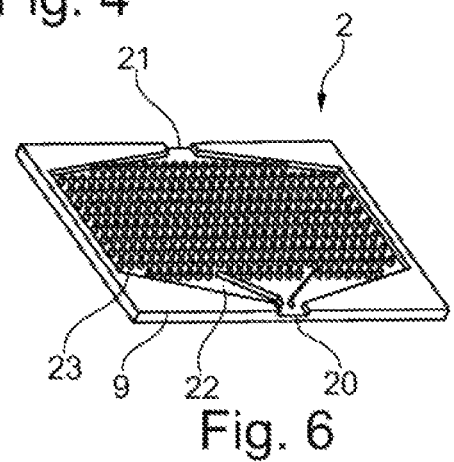
Fig. 6

DEVICE FOR COOLING A POWER ELECTRONICS CIRCUIT

The present invention relates to power electronics circuits and more particularly to the cooling thereof.

Conventionally, speed variators for electric motors comprise power electronics circuits which may each dissipate over one kW and the cooling of which is achieved by circulating a liquid.

The circuit or circuits are fixed to a heatsink through which a liquid circulates. DE 10 2006 057 796 and US 2015/0096719 disclose cooling devices comprising a fluid-circulation heatsink.

It is known practice to place the circuit or circuits that are to be cooled in direct contact with the cooling liquid, and the mounting on the heatsink entails the creation of a sealing zone.

Such mounting makes variator maintenance more complicated. This is because the intervention required for replacing a power electronics circuit entails cutting off the supply of liquid to the heatsink and draining same. This results in the risk of liquid leaking onto the electronics circuit or circuits, leading to a risk to the safety of the users and/or of the variator, when fitting and/or refitting the heatsink, an appreciable intervention time for the applications concerned which are often critical and which demand a high level of availability, and increased complexity of the maintenance because of the need to call upon the services of at least two different trades.

There is therefore a need to facilitate the maintenance of the speed variators and other power electronics apparatuses comprising one or more power electronics circuits that are to be liquid cooled.

The invention meets this need by proposing a cooling device for cooling at least one power electronics circuit, comprising:

a liquid-cooled heatsink; and an interface plate in thermal contact with the heatsink and on which the power electronics circuit or circuits is or are fixed, the interface plate being mounted removably on the heatsink so that it can be detached therefrom with the electronics circuit or circuits fixed on it.

The invention facilitates maintenance by allowing the power electronics circuit or circuits to be removed from the heatsink without the need to drain same.

The invention also offers new possibilities in how the power electronics circuit or circuits is or are set out relative to the heatsink.

For preference, the interface plate is made of copper or of aluminum or of any other material, preferably metallic, that is a good conductor of heat.

The thickness of the interface plate is, for example, comprised between 5 and 20 millimeters, preferably being greater than or equal to 10 millimeters.

The interface plate may be rigid so as to contribute to the mechanical stability of the cooling device. The power electronics circuit or circuits may be varied and comprise one or more power electronics components, such as notably power transistors of the IGBT or MOSFET type.

The cooling device may receive one or more power electronics circuits, for example three power electronics circuits corresponding to the three phases of the motor.

Each power electronics circuit may be fixed to the interface plate at one or more points. For example, each power electronics circuit is fixed to the interface plate at two or more points, for example at four points. This fixing may be achieved for example using screws or rivets or even using elastic clips.

The power electronics circuit or circuits may comprise a sole plate, notably made of metal, preferably electrically insulated, which allows good thermal contact with the interface plate.

The sole plate may be in contact with the interface plate with the interposition of a thermal grease and/or of a thermal contact sheet made from an elastomeric material that is a good conductor of heat.

In an alternative, the electronics circuit or circuits are fixed to one or more corresponding sole plates which are of one piece with the interface plate. When there are several power electronics circuits to be cooled, these are preferably set out on the interface plate in such a way that the cooling of these circuits is as uniform possible.

For example, in instances in which the heatsink has passing through it a serpentine canal which loops back and forth in a first direction, it may be beneficial for the power electronics components to be positioned across the entire width of the serpentine coil, side by side in the first direction. For example, the electronics circuits have an elongate shape and their longitudinal axis is perpendicular to this first direction. The width of the serpentine coil defines a second direction perpendicular to the first.

The interface plate may in itself comprise one or more cooling means such as a thermosiphon, aimed for example at evening out the temperature of the interface plate or at allowing heat transfer from a first part of the interface plate to a second part.

For preference, the interface plate comprises a face for accepting the power electronics circuit or circuits of which the extent is at least substantially equal to that of the heatsink with which the plate is in contact. It is thus possible to benefit from all or almost all of the exchange surface area offered by the heatsink.

In one exemplary embodiment, the interface plate, the circuit or circuits to be cooled, and the heatsink are superposed without appreciable overhang of one relative to another.

In an alternative form, the circuit or circuits to be cooled are laterally offset with respect to the heatsink.

In particular, it is possible to create the interface plate with a first part which completely covers the heatsink and a second part connected to the first part by at least one thermosiphon and which is surmounted by the circuit or circuits to be cooled.

The heatsink may comprise one or more heat pipes.

The heatsink may have passing through it a liquid that circulates between the heatsink and a cold source, for example a refrigeration unit. The liquid may circulate with no change in phase.

In an alternative, the heatsink is cooled by a liquid which undergoes at least one phase change, for example which vaporizes as a result of the heat given off by the electronics circuit or circuits to be cooled and which condenses at the cold source.

A further subject of the invention is an assembly comprising the cooling device according to the invention and at least one power electronics circuit fixed on top so as to be cooled.

The power dissipated by the circuit may be greater than or equal to one kW, or even 2 or 5 kW.

A further subject of the invention is a speed variator for an electric motor comprising an assembly according to the invention.

The invention may be better understood from reading the following detailed description of some nonlimiting implementation examples thereof and from studying the attached drawing in which:

FIG. 1 is an exploded and schematic view of one example of a cooling device according to the invention, equipped with power electronics circuits to be cooled, FIG. 2 is a schematic cross section of the cooling device of FIG. 1, in the region of a power electronics circuit, FIG. 3 is a view similar to FIG. 2 of an alternative form of embodiment of the interface plate, FIG. 4 is another view similar to FIG. 2 of an alternative form of embodiment, FIG. 5 depicts an alternative form of embodiment of the heatsink, and FIG. 6 is a view similar to FIG. 5 of an alternative form of embodiment of the heatsink.

The assembly 10 depicted in FIG. 1 comprises a cooling device 1 and a plurality of power electronics circuits 4, each comprising a thermal sole plate 5.

The cooling device 1 comprises a heatsink 2 which is surmounted by an interface plate 3 on which the electronics circuits 4 are fixed. In the example illustrated, the fixing of the interface plate 3 to the heatsink 2 is achieved by bolting using screws 6, and the fixing of the circuits 4 to the interface plate 3 is likewise achieved by bolting using screws 7.

The screws 6 are fixed into the corresponding tappings 8 of the heatsink and the screws 7 are screwed into blind tapped holes in the interface plate 3, these not being visible in FIG. 1.

Each circuit 4 for example has a parallelepipedal general shape, being fixed to the interface plate 3 at each corner by a screw 7.

The heatsink is cooled by a circulation of a liquid between an inlet 11 and an outlet 12. The fluid which circulates through the heatsink 2 is cooled by a cold source, not depicted, for example a refrigeration unit.

As can be seen in FIG. 2, the heatsink 2, the interface plate 3 and the electronics circuits 4 may be vertically superposed, which means to say superposed in a direction perpendicular to the plane of the interface plate 3.

In the alternative form illustrated in FIG. 3, the electronics circuits 4 are offset laterally with respect to the heatsink 2. The interface plate 3 may overhang the heatsink 2 laterally on at least one side, notably on two opposite or adjacent sides, or even on three or four sides. To make it easier to transfer the heat enemy dissipated by the electronics circuits 4, the plate 3 ring be provided with one or more thermosiphons 6A extending between the lateral part to which the electronics circuits 4 are fixed and the heatsink 2.

In the alternative form illustrated in FIG. 4, the interface plate 3 is made in two separate parts 3a and 3b, the part 3a being fixed to the heatsink 2 and the part 3b supporting the power electronics circuits 4. The parts 3a and 3h are connected by one or more thermosiphons 6A, which may also provide the mechanical cohesion of the whole. In another alternative form, mechanical cohesion is afforded at least in part by a support, not depicted, to which the heatsink 2 and the part 3b are secured.

It is possible to produce the heatsink 2 in various ways. In one example illustrated in FIG. 5, the heatsink 2 has passing through it a heat pipe in the form of a serpentine coil. This serpentine coil 9 has straight portions 15 which are connected to one another by curved portions 17. The heatsink 2 may comprise a plate 9 which is machined to define housings to accommodate all or part of the serpentine coil and in particular the straight portions 15. The serpentine coil may be defined by an added tube, notably made of aluminum. In one alternative form, the heat pipe or pipes are machined directly into a plate that forms a constituent part of the heatsink.

By way of alternative, FIG. 6 illustrates a fluid circuit machined directly into the plate 9 of the heatsink.

This fluid circuit comprises an inlet 20 and an outlet 21, one or more liquid distribution canals 22 and one or more baffles 23 making it possible to ensure good distribution of the liquid across the entire extent of the plate and, where appropriate, turbulent flow to improve heat exchanges.

Of course, the invention is not restricted to the examples which have just been described.

For example, the heatsink and/or the interface plate may be produced with a bowed shape, for example to make the cooling device easier to attach to a cylindrical casing of a motor.

Aside from the cooling of the heatsink by liquid, it is also possible to plan cooling by natural or forced convection, using the ambient air for example.

In order to replace one or more power electronics circuits 4, the screws 6 can be removed in order to detach the interface plate 3 from the heatsink 2. Next, the damaged electronics circuit or circuits can be removed. Once this or these circuit or circuits has or have been replaced, the interface plate can be reattached to the heatsink 2. During the course of these operations there is no need to drain the cooling liquid circuit.

In addition to being applicable to the cooling of electronics circuits for speed variators, the invention also applies to energy conversion electronics circuits, notably inverters, direct-direct current converters, controlled rectifiers and power regulators for alternators and more generally any power electronics devices.

The invention claimed is:

1. A cooling device for cooling at least one power electronics circuit, comprising:
   a liquid-cooled heatsink; and
   an interface plate in thermal contact with the heatsink and on which the power electronics circuit or circuits is or are fixed,
   the interface plate, which comprises at least one thermosiphon, being mounted removably on the heatsink so that it can be detached therefrom with the electronics circuit or circuits fixed on it.

2. The cooling device as claimed in claim 1, the interface plate being made of copper or of aluminum.

3. The cooling device as claimed in claim 1, the interface plate having a face for accepting the circuit or circuits of which the extent is at least substantially equal to that of the heatsink with which the plate is in contact.

4. The cooling device as claimed in claim 1, the interface plate, the circuit or circuits to be cooled, and the heatsink being superposed without appreciable overhang.

5. The cooling device as claimed in claim 1, the interface plate comprising a first part completely covering the heatsink and a second part connected to the first by said at least one thermosiphon and surmounted by the circuit or circuits to be cooled.

6. The cooling device as claimed in claim 1, the heatsink comprising one or more heat pipes.

7. An assembly comprising a cooling device as claimed in claim 1 and at least one electronics circuit to be cooled fixed on top.

8. The assembly as claimed in claim 7, the power dissipated by each circuit being greater than or equal to 1 kW.

9. The assembly as claimed in claim 7, the electronics circuit or circuits comprising and/or being made up of one or more power components selected from power transistors of the IGBT or MOSFET type.

10. A speed variator for an electric motor comprising an assembly as claimed in claim 7.

11. An assembly comprising at least one power electronics circuit and a cooling device for cooling said at least one power electronics circuit, the cooling device comprising:
 a liquid-cooled heatsink; and
 an interface plate in thermal contact with the heatsink and on which the power electronics circuit or circuits is or are fixed,
 the interface plate being mounted removably on the heatsink so that it can be detached therefrom with the electronics circuit or circuits fixed on it, the circuit or circuits to be cooled being laterally offset with respect to the heatsink.

12. An assembly comprising at least one power electronics circuit and a cooling device for cooling said at least one power electronics circuit, the cooling device comprising:
 a liquid-cooled heatsink; and
 an interface plate in thermal contact with the heatsink and on which the power electronics circuit or circuits is or are fixed,
 the interface plate being mounted removably on the heatsink so that it can be detached therefrom with the electronics circuit or circuits fixed on it, each electronics circuit comprising a thermal sole plate, that comes into contact with the interface plate.

* * * * *